United States Patent
Lin

(10) Patent No.: US 7,151,593 B2
(45) Date of Patent: Dec. 19, 2006

(54) METHOD FOR IMAGING WAFERS USING A PROJECTION MASK ALIGNER

(75) Inventor: Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/412,555

(22) Filed: Apr. 27, 2006

(65) Prior Publication Data

US 2006/0187440 A1    Aug. 24, 2006

Related U.S. Application Data

(62) Division of application No. 10/233,916, filed on Sep. 3, 2002, now Pat. No. 7,061,589.

(51) Int. Cl.
G03B 27/32 (2006.01)
G03B 27/62 (2006.01)
G03F 1/00 (2006.01)
G03C 5/00 (2006.01)

(52) U.S. Cl. ............................. 355/77; 355/75; 430/5; 430/311

(58) Field of Classification Search .................. 355/75, 355/77; 430/5, 311
See application file for complete search history.

(56) References Cited

U.S. PATENT DOCUMENTS

| | | | |
|---|---|---|---|
| 4,378,953 A | 4/1983 | Winn | |
| 6,264,773 B1 | 7/2001 | Cerio | |
| 6,279,249 B1 | 8/2001 | Dao et al. | |
| 6,300,019 B1 | 10/2001 | Ikeda et al. | |
| 6,715,495 B1 | 4/2004 | Dao et al. | |
| 6,731,378 B1 | 5/2004 | Hibbs | |
| 2002/0154285 A1 | 10/2002 | Ramamoorthy et al. | |
| 2003/0227605 A1 | 12/2003 | del Puerto et al. | |

Primary Examiner—Rodney Fuller
(74) Attorney, Agent, or Firm—Haynes and Boone, LLP

(57) ABSTRACT

A method uses a projection mask aligner that includes a hard pellicle mounting apparatus having an enclosure with an interior cavity, an inlet port for receiving a mask with a protective cover, and an outlet port for outputting a mask covered by a hard pellicle, that has a demounting portion for removing the protective cover from the mask, that has a mounting portion for mounting the hard pellicle on the mask, and that has a conduit for receiving a light-transmitting gas. The method includes: forming a hard pellicle/mask assembly having at least one hard pellicle mounted thereon; positioning the hard pellicle/mask assembly between a light source and an imaging lens; positioning a photoresist-coated semiconductor wafer under the imaging lens with a photoresist layer facing the lens; and imaging microelectronics circuits from the hard pellicle/mask assembly onto the semiconductor wafer.

5 Claims, 3 Drawing Sheets

METHOD FOR IMAGING WAFERS USING A PROJECTION MASK ALIGNER

This application is a division of U.S. Ser. No. 10/233,916 filed Sep. 3, 2002 now U.S. Pat. No. 7,061,589.

FIELD OF THE INVENTION

The present invention generally relates to an apparatus and a method for photolithography and more particularly, relates to an apparatus and a method for mounting a hard pellicle to a mask such that the mask can be readily installed in a projection mask aligner.

BACKGROUND OF THE INVENTION

A pellicle is a piece of transparent material mounted at a distance from the absorber surface on a reticle in the direction of the wafer. The distance is chosen to be out of focus from the wafer, so that any foreign particles fallen on the surface of the pellicle is out of focus on the wafer, thus not contributing to printing defects.

The thickness of a pellicle is preferred to be small so that its presence in the optical path does not affect the performance of the imaging lens. It is usually in the order of a few micrometers. Therefore, only polymer films can be found to have satisfactory optical and mechanical properties for pellicle materials. Polymer materials have been available as the imaging wavelength was reduced from 436 to 365, 248 and 193 nm.

When the imaging wavelength is further reduced to 157 nm, there is difficulty in developing a thin and durable soft material that has sufficient light transmission. One has to use pellicles which is much thicker and rigid. With a thickness sufficient to satisfy the mechanical requirement, it is already affecting the imaging property of the lens. Therefore, the flatness, smoothness and parallelism of a thick pellicle have to be of high optical quality, making it very expensive.

Another drawback in using either soft or hard pellicles in 157 nm lithography is the requirement of an oxygen-free transmission space. The entire optical path in a 157 nm imaging tool is flushed with high-purity nitrogen to prevent oxygen from getting into it. The pellicle either has to permanently seal nitrogen in its enclosed volume with the mask or has to allow for quick replacement of air with nitrogen when it is loaded in the imaging tool. Either case is not easy to implement.

It is therefore an object of the present invention to provide a mask that is protected by a pellicle which does not have the drawbacks or shortcomings of the conventional mask/pellicle assembly.

It is another object of the present invention to provide an apparatus for mounting a hard pellicle to a mask wherein the hard pellicle has optical transmission properties at least those of quartz.

It is a further object of the present invention to provide an apparatus for mounting a hard pellicle to a mask in an environment filled with a light-transmitting gas so that the interior cavity between the mask and the hard pellicle is light-transmitting.

It is still another object of the present invention to provide an apparatus for mounting two hard pellicles to a mask with one on each side of the mask.

It is still another object of the present invention to provide an apparatus for mounting at least one hard pellicle to a mask which includes delivery means for delivering the at least one hard pellicle covered mask to a scanner.

It is yet another object of the present invention to provide an improved projection mask aligner in which a mask having a protective hard pellicle mounted thereon is positioned in-between a light source and an imaging lens.

SUMMARY OF THE INVENTION

In accordance with the present invention, an apparatus and a method for mounting at least one hard pellicle to a mask are disclosed.

In a preferred embodiment, an apparatus for mounting at least one hard pellicle to a mask is provided which includes an enclosure having an interior cavity sufficiently large to accommodate a mask, an inlet port for receiving a mask with a protective cover mounted thereon, and an outlet port for outputting a mask covered by at least one hard pellicle; demounting means for removing the protective cover from the mask; mounting means for mounting the at least one hard pellicle on the mask forming a hard pellicle/mask assembly; and conduit means for receiving a light-transmitting gas and filling the interior cavity with the light-transmitting gas.

The apparatus for mounting a hard pellicle to a mask may further include delivery means for delivering the at least one hard pellicle covered mask to a scanner. The light-transmitting gas may be a gas that transmits at least 70% of a light that has a wavelength smaller than 200 nm, the light-transmitting gas may be an inert gas selected from the group consisting of $N_2$, Ar and He. The mounting means may include mechanical clamps, and may include mounting a first hard pellicle on the mask juxtaposed to a surface having a layer of chrome coating. The mounting means may further include mounting a second hard pellicle on the mask juxtaposed to a surface opposite to the surface that has the layer of chrome coating. The at least one light-transmitting gas may be an inert gas selected from the group consisting of $N_2$, Ar and He. The apparatus may further include a plurality of spacers of predetermined thickness mounted in-between the at least one hard pellicle and the mask. The apparatus may further include hard pellicle storage means, mask storage means, or hard pellicle/mask assembly storage means.

The present invention is further directed to an improved projection mask aligner of the type in which a mask having a protective cover mounted thereon is positioned in-between a light source and an imaging lens for projecting an image on a photoresist coated semiconductor wafer in order to form microelectronic circuits on the semiconductor wafer, wherein the improvement includes a hard pellicle mounting apparatus that is positioned juxtaposed to the projection mask aligner for delivering a hard pellicle/mask assembly into the projection mask aligner, the hard pellicle mounting apparatus further includes an enclosure that has an interior cavity sufficiently large to accommodate a mask, an inlet port for receiving a mask with a protective cover mounted thereon, and an outlet port for outputting a mask covered by at least one hard pellicle; demounting means for removing the protective cover from the mask; mounting means for mounting the at least one hard pellicle on the mask forming a hard pellicle/mask assembly; and conduit means for receiving a light-transmitting gas and filling the interior cavity with the light-transmitting gas.

In the improved projection mask aligner, the aligner further includes a delivery means for delivering the hard pellicle/mask assembly into the projection mask aligner. The light-transmitting gas is a gas that transmits at least 70% of a light that has a wavelength smaller than 200 nm. The mounting means may include mechanical clamps. The light-transmitting gas may be an inert gas that is selected from the group consisting of $N_2$, Ar and He. The at least one hard pellicle may have optical properties at least that of a quartz lens. The aligner further includes a plurality of spacers of predetermined thickness that are mounted in-between the at least one hard pellicle and the mask.

The present invention is further directed to a method for imaging wafers using a projection mask aligner which can be carried out by the operating steps of first providing a projection mask aligner equipped with a hard pellicle mounting apparatus, the hard pellicle mounting apparatus further includes an enclosure that includes an interior cavity sufficiently large to accommodate a mask, an inlet port for receiving a mask with a protective cover mounted thereon, and an outlet port for outputting a mask covered by at least one hard pellicle; demounting means for removing the protective cover from the mask; mounting means for mounting the at least one hard pellicle on the mask forming a hard pellicle/mask assembly; and conduit means for receiving a light-transmitting gas; forming a hard pellicle/mask assembly that has at least one hard pellicle mounted thereon; positioning the hard pellicle/mask assembly in-between a light source and an imaging lens; positioning a photoresist coated semiconductor wafer under the imaging lens with a photoresist layer facing the lens; and imaging microelectronic circuits on the hard pellicle/mask assembly onto the semiconductor wafer.

The method for imaging wafers using a projection mask aligner may further include the step of flowing a light-transmitting gas into and filling the interior cavity of the enclosure. The method may further include the step of forming the hard pellicle/mask assembly by clamping at least one pellicle to the mask by mechanical means. The method may further include the step of supplying the at least one hard pellicle in a material that has optical properties at least that of quartz. The method may further include the step of storing the at least one hard pellicle in the hard pellicle mounting apparatus.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses an apparatus for mounting at least one hard pellicle to a mask wherein the apparatus may be attached to a projection mask aligner (or scanner). The invention further discloses an improved projection mask aligner in which a hard pellicle mounting device is mounted to the side of the projection mask aligner for installing at least one hard pellicle on a mask and then delivering the hard pellicle/mask assembly into the aligner.

One of the benefits made possible by the present invention novel apparatus is to reduce the cost of hard pellicles without sacrificing the imaging performance. Another benefit made possible by the present invention novel apparatus is the inherent replacement of air by a non-light-absorbing gas, i.e., a light-transmitting gas, in the space between the hard pellicle and the mask.

The benefits of reducing the cost of hard pellicle and the rapid replacement of air by a light-transmitting gas can be achieved by installing a lens-quality thick pellicle in a pellicle preparation space that is already flushed with a non-light-absorbing gas. The space can be in the imaging tool itself or can be linked to the imaging tool environmentally. Prior to the use of the imaging tool, the mask can be protected with a cover that may not transmit the actinic light. When the mask is needed for exposure, the protective cover is removed in the pellicle preparation space, i.e. in the interior cavity of the present invention novel hard pellicle mounting device, and then the hard pellicle of optical quality is mounted on the mask. The hard pellicle/mask assembly is then sent to the reticle holder in the imaging tool.

Figure 1:
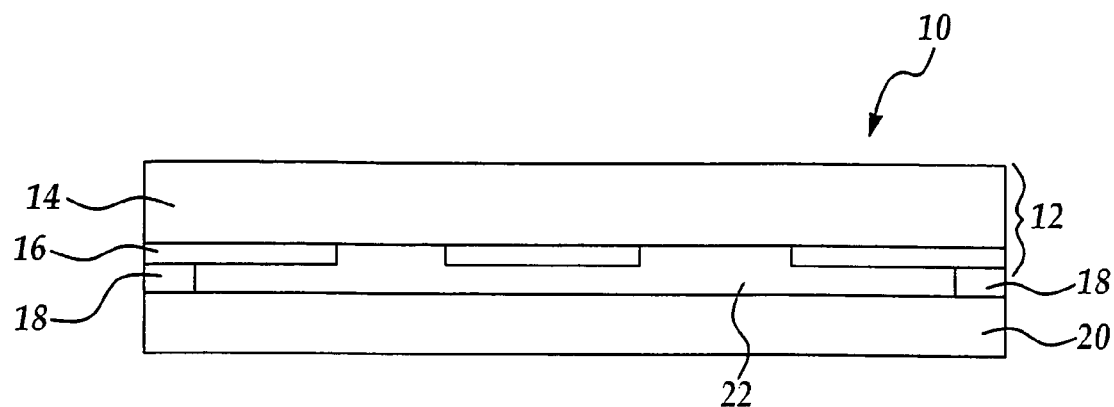
FIG. 1 is a cross-sectional view of a preferred embodiment of the present invention hard pellicle/mask assembly with a single pellicle mounted on the mask.

Referring initially to FIG. 1, wherein a cross-sectional view of a present invention hard pellicle/mask assembly 10 is shown. A mask 12 is first provided which is constructed by a blank 14 coated with a chrome layer 16. The chrome layer 16 is also known as the absorber. After a plurality of spacers 18 are placed on the chrome-coated surface of the blank 14, a hard pellicle 20 is mounted to the mask 12 to protect the chrome layer 16 which forms a pattern of the circuit to be reproduced. In the space 22 between the hard pellicle 20 and the mask 12 formed by the plurality of spacers 18, an inert gas that is light-transmitting is used to fill the cavity 22. The light-transmitting gas may be an inert gas selected from $N_2$, Ar and He. The light-transmitting gas normally transmits at least 70% of a light that has a wavelength smaller than 200 nm. In the preferred and alternate embodiments of the present invention, the light-transmitting gas utilized is $N_2$.

Figure 2:
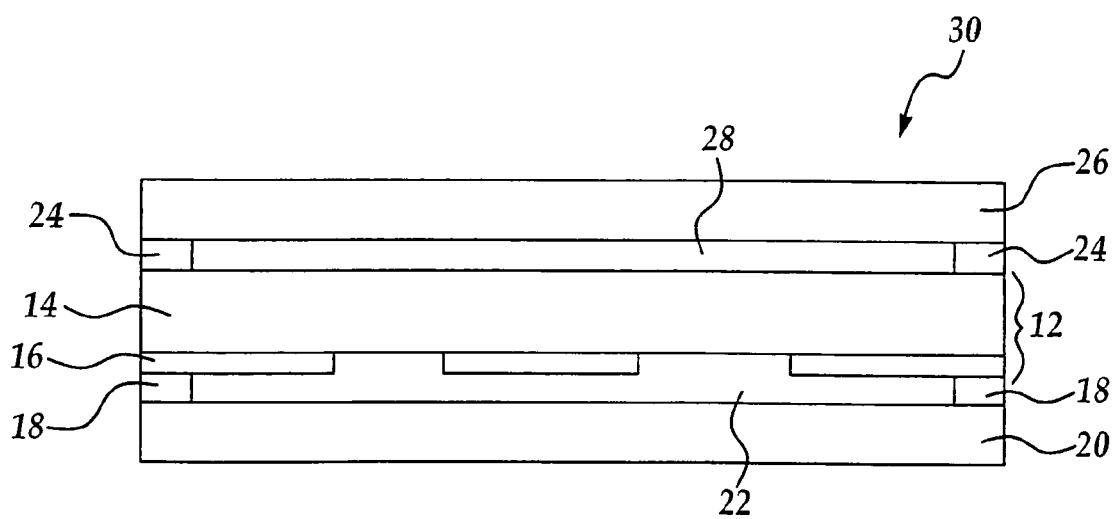
FIG. 2 is a cross-sectional view of an alternate embodiment of the present invention hard pellicle/mask assembly with two hard pellicles mounted on both sides of the mask.

An alternate embodiment 30 of the present invention hard pellicle/mask assembly is shown in FIG. 2. Similar to the preferred embodiment 10 shown in FIG. 1, a second plurality of spacers 24 that have a predetermined thickness is used in-between the mask 12 and the second hard pellicle 26. An interior space 28 formed by the second hard pellicle 26 and the mask 12 is similarly filled with a light-transmitting gas of $N_2$.

Figure 3:
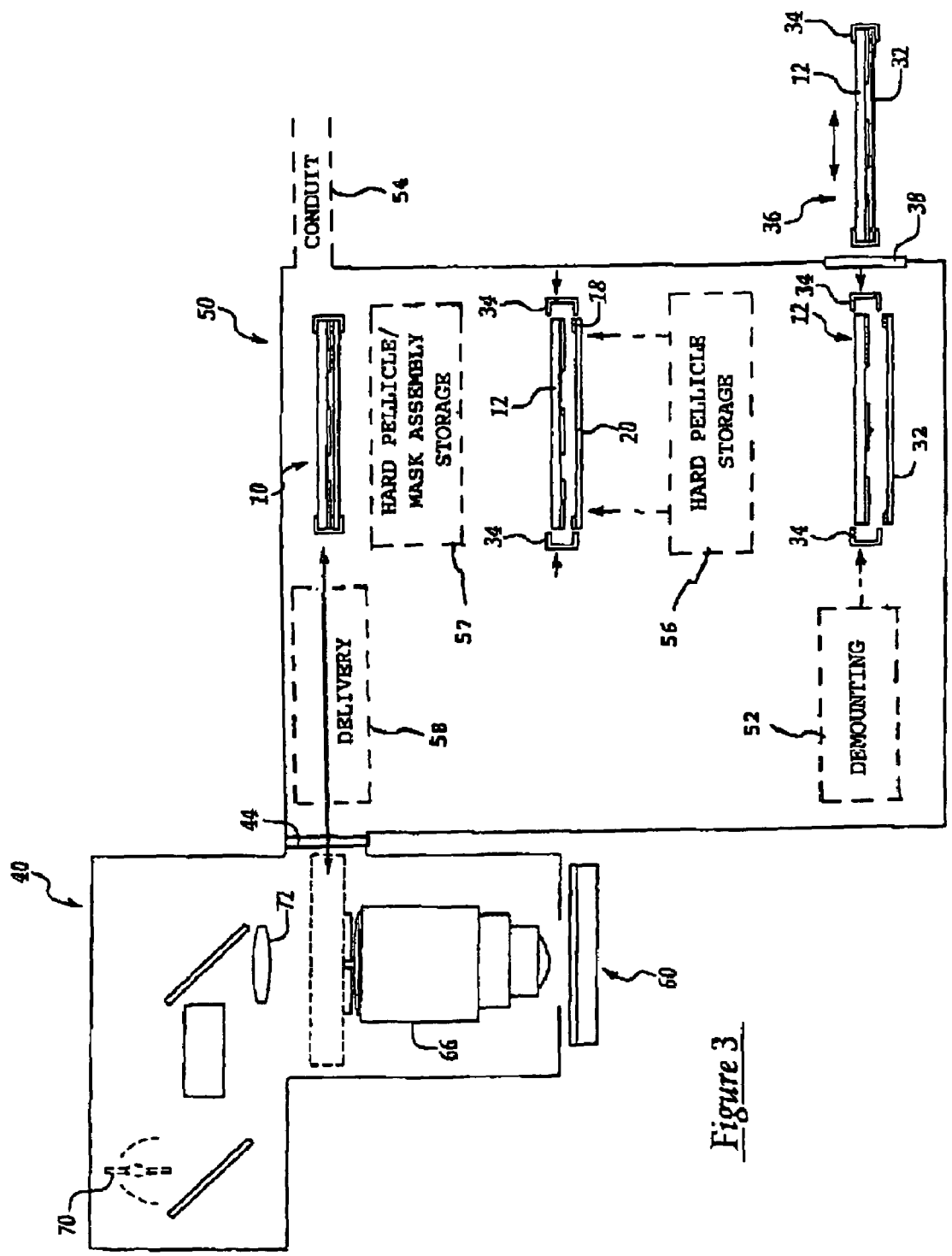
FIG. 3 is a cross-sectional view of a scanner equipped with the present invention hard pellicle mounting device wherein a single hard pellicle is mounted.
Figure 4:
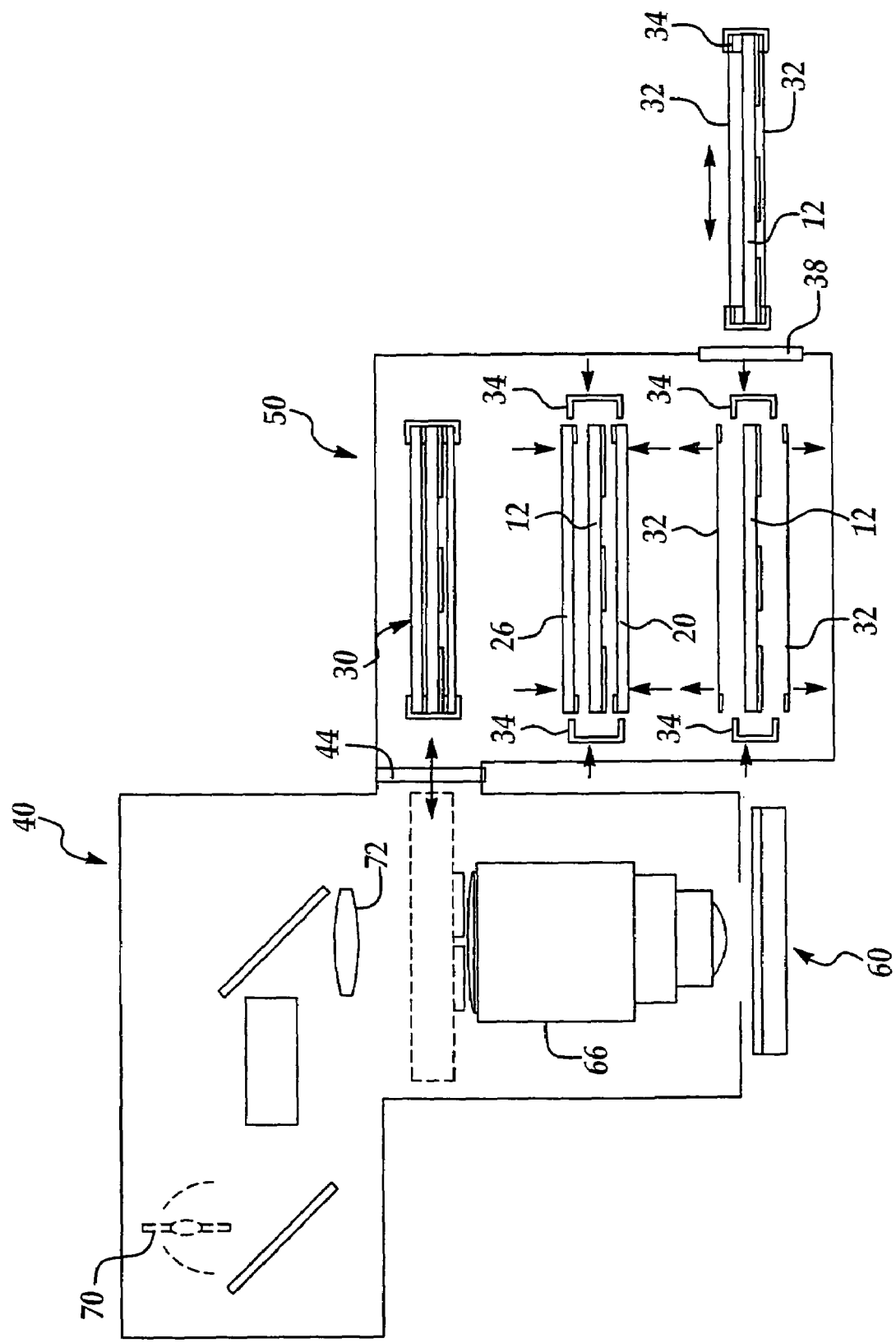
FIG. 4 is a cross-sectional view of a scanner equipped with the present invention hard pellicle mounting device wherein two hard pellicles are mounted to a mask.

The first hard pellicle 20 and the second hard pellicle 26 have optical properties at least that of a quartz lens in order to maintain the imaging intensity of the imaging system of the scanner. This is shown in FIGS. 3 and 4. It should be noted that in many circumstances, a mask 12 may only need a single hard pellicle mounted on the chrome-coating side, or the side with the patterned absorber layer. The light-transmitting gas used in the present invention to fill the interior cavities 22, 28 prevents any light loss due to the presence of the gas. As shown in FIGS. 3 and 4, either a mask covered by a single hard pellicle or a mask covered by two hard pellicles is provided for exposure in the scanner 40. In the pellicle preparation space 50, a mask 12 is first disassembled with the protective cover 32 removed and stored in the pellicle preparation space 50. The removal of the protective cover 32 is accomplished by a demounting means 52 which removes the clamps 34 that were used to hold the protective cover onto the mask 12. The mask/protective cover assembly 36 is first transported into the pellicle preparation space 50 through an input door 38 mounted at one end of the pellicle preparation space 50. A conduit 54 is provided for filling the interior of the enclosure with the light-transmitting gas. The apparatus includes storage 56 for a hard pellicle 20.

After the clamps 34 are temporarily removed from the mask 12 and the protective cover 32 is removed, a hard pellicle 20 with a plurality of spacers 18 positioned along the edges of the hard pellicle 20 is mounted to the mask 12 and then clamped by the mechanical clamp 34. The apparatus includes storage 57 for a resulting hard pellicle/mask assembly 10. The hard pellicle/mask assembly 10 is then transported by a delivery arrangement 58 through an output door 44 into the scanner 40 for projecting and exposing an image onto a semiconductor wafer 60. A series of imaging lenses 66 are used in controlling the imaging and the exposure process. An optical source 70 is utilized in projecting through lens 72 into the hard pellicle/mask assembly 10.

FIG. 4 shows an alternate embodiment of the present invention wherein a hard pellicle/mask assembly 30 covered on both sides by hard pellicles 20 and 26 is utilized in place of the hard pellicle/mask assembly 10 shown in FIG. 3.

The present invention apparatus for mounting at least one hard pellicle to a mask and a projection mask aligner with a hard pellicle preparation space mounted thereto have therefore been amply described in the above description and in the appended drawings of FIGS. 1–4.

While the present invention has been described in an illustrative manner, it should be understood that the terminology used is intended to be in a nature of words of description rather than of limitation.

Furthermore, while the present invention has been described in terms of one preferred and one alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for imaging wafers using a projection mask aligner comprising the steps of:

providing a projection mask aligner equipped with a hard pellicle mounting apparatus, said hard pellicle mounting apparatus further comprises an enclosure comprising an interior cavity sufficiently large to accommodate a mask, and inlet port for receiving a mask with a protective cover mounted thereon, and an outlet port for outputting a mask covered by at least one hard pellicle; demounting means for removing said protective cover from said mask; mounting means for mounting said at least one hard pellicle on said mask forming a hard pellicle/mask assembly; and conduit means for receiving a light-transmitting gas;

forming a hard pellicle/mask assembly having at least one hard pellicle mounted thereon;

positioning said hard pellicle/mask assembly in-between a light source and an imaging lens;

positioning a photoresist coated semiconductor wafer under said imaging lens with a photoresist layer facing said lens; and imaging microelectronics circuits on said hard pellicle/mask assembly onto said semiconductor wafer.

2. The method for imaging wagers using a projection mask aligner according to claim 1 further comprising the step of flowing a light-transmitting gas into and filling said interior cavity of said enclosure.

3. The method for imaging wafers using a projection mask aligner according to claim 1 further comprising the step of forming said hard pellicle/mask assembly by clamping at least one pellicle to said mask by mechanical means.

4. The method for imaging wagers using a projection mask aligner according to claim 1 further comprising the step of supplying said at least one hard pellicle in a material having optical properties at least that of quartz.

5. The method for imaging wagers using a projection mask aligner according to claim 1 further comprising the step of storing at least one hard pellicle in said hard pellicle mounting apparatus.

* * * * *